(12) United States Patent
Rabello et al.

(10) Patent No.: US 8,170,838 B2
(45) Date of Patent: May 1, 2012

(54) SIMULATING TWO-DIMENSIONAL PERIODIC PATTERNS USING COMPRESSED FOURIER SPACE

(75) Inventors: Silvio J. Rabello, Palo Alto, CA (US); William A. McGahan, Spicewood, TX (US); Jie Li, Milpitas, CA (US)

(73) Assignee: Nanometrics Incorporated, Milpitas, CA (US)

( * ) Notice: Subject to any disclaimer, the term of this patent is extended or adjusted under 35 U.S.C. 154(b) by 447 days.

(21) Appl. No.: 12/430,805

(22) Filed: Apr. 27, 2009

(65) Prior Publication Data

US 2010/0274521 A1 Oct. 28, 2010

(51) Int. Cl.
*H03F 1/26* (2006.01)
*G06F 15/00* (2006.01)

(52) U.S. Cl. .......... 702/189; 359/237; 372/24; 600/409; 702/27; 702/127

(58) Field of Classification Search .................... 702/27, 702/76, 127, 167, 189; 356/601, 625; 359/237, 359/368; 372/24; 378/71; 600/409; 250/225
See application file for complete search history.

(56) References Cited

U.S. PATENT DOCUMENTS

| | | | |
|---|---|---|---|
| 5,600,666 A | 2/1997 | Hiiro | |
| 6,430,256 B1 * | 8/2002 | Yacoby | 378/71 |
| 6,477,398 B1 | 11/2002 | Mills | |
| 6,898,537 B1 | 5/2005 | McGahan | |
| 7,115,858 B1 | 10/2006 | Holden et al. | |
| 2003/0204325 A1 | 10/2003 | Niu et al. | |
| 2005/0068545 A1 | 3/2005 | Niu et al. | |
| 2008/0043314 A1 | 2/2008 | Hagler | |

OTHER PUBLICATIONS

International Search Report mailed on Jun. 17, 2010 for PCT Application No. PCT/US2010/031778 filed on Apr. 20, 2010, by Nanometrics, Incorporated, 12 pages.
Moharam et al., "Rigorous coupled-wave analysis of planar grating diffraction", J. Opt. Soc. Am., vol. 71, No. 7, pp. 811-818 (1983).
Moharam et al., "Stable implantation of the rigorous coupled wave analysis for surface-relief gratings: enhanced transmittance matrix approach" J. Opt. Soc. Am. A., vol. 42, No. 5, pp. 1077-1086 (1995).
Gaylord et al., "Analysis and Applications of Optical Diffraction by Gratings", Proceedings of the IEEE, vol. 73, No. 5, pp. 894-937 (1985).
Chateau et al., "Algorithm for the rigorous coupled-wave analysis of grating diffraction", J. Opt. Soc. A, A, vol. 41, No. 4, pp. 1321-1331 (Apr. 1994).
Moharam et al., "Formulation for stable and efficient implementation of the rigorous coupled-wave analysis of binary grating", J. Opt. Soc. Am. A., vol. 42, No. 5, pp. 1068-1076 (May 1995). Li, "New formulation of the Fourier modal method for crossed surface-relief gratings", J. Opt. Soc. Am. A/vol. 14, No. 10, pp. 2758-2767 (Oct. 2007).

\* cited by examiner

*Primary Examiner* — John H Le
(74) *Attorney, Agent, or Firm* — Silicon Valley Patent Group LLP

(57) ABSTRACT

The process of modeling a complex two-dimensional periodic structure is improved by selectively truncating the Fourier expansion used in the calculation of resulting scatter signature from the model. The Fourier expansion is selectively truncated by determining the contribution for each harmonic order in the Fourier transform of the permittivity function and retaining the harmonic orders with a contribution that is above a threshold. The Fourier space may be compressed so that only the selected harmonic orders are used, thereby reducing the required memory and calculation times. The compressed Fourier space may be used in a real-time analysis of a sample or to generate a library that is used in the analysis of a sample.

34 Claims, 8 Drawing Sheets

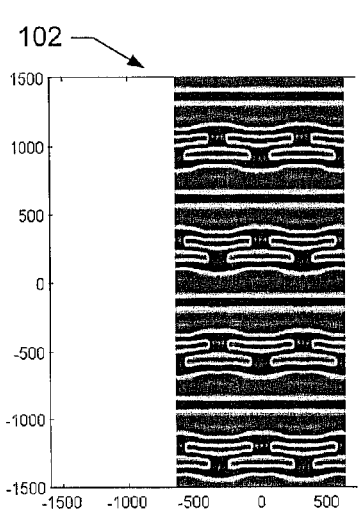
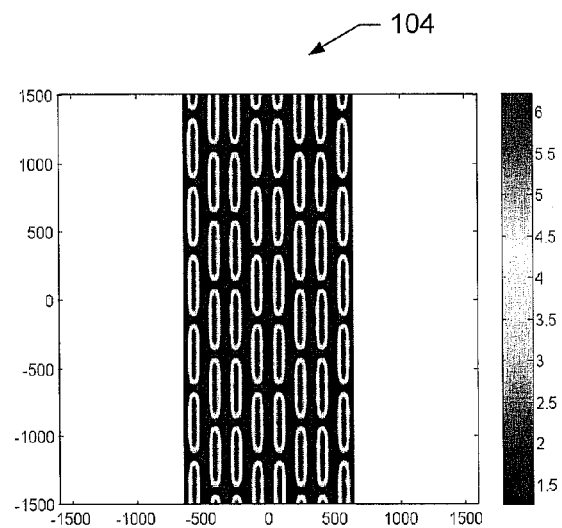
Fig. 2A        Fig. 2B
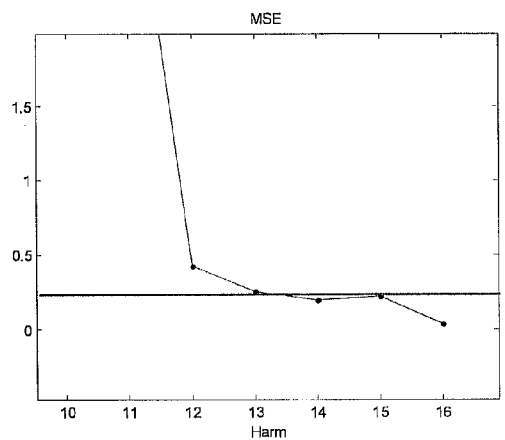
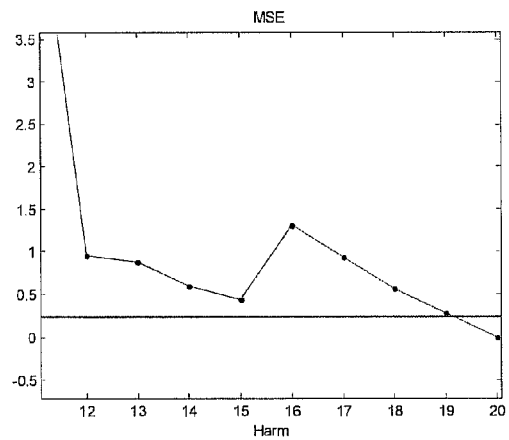
Fig. 3A        Fig. 3B

SIMULATING TWO-DIMENSIONAL PERIODIC PATTERNS USING COMPRESSED FOURIER SPACE

BACKGROUND

During semiconductor manufacturing and the like, it is necessary to measure device structures to ensure the manufacturing accuracy. The manufacturing accuracy, such as dimensional control of structures, is necessary to achieve the desired performance of the finished device. Optical metrology is particularly well suited for measuring device structures because optical metrology is nondestructive, accurate, repeatable, fast, and inexpensive.

One type of optical metrology tool that may be used, particularly for the measurement of sub-resolution diffracting structures, is a scatterometer. Scatterometry measures structures using light that is scattered from the structure, sometimes referred to as a scatter signature. With scatterometry, modeling techniques are used in which the sample is modeled and the resulting scatter signature is mathematically calculated from the model using, e.g., a rigorous numerical method. When the calculated scatter signature has a good fit with the scatter signature measured from a sample, the model is considered to be an accurate description of the sample. If the calculated scatter signature does not fit well with the measured scatter signature, one or more variable parameters in the model may be adjusted and the resulting scattered light calculated for the adjusted model. The model may be repeatedly adjusted until the fit between the calculated scatter signature and the measured scatter signature are within tolerance. In some systems, multiple varying models may be pre-generated and stored, along with their associated calculated scatter signature, in a library that is consulted during the measurement of a sample.

Modeling techniques, including calculating the resulting scatter signatures, are particularly useful when the sample to be measured is a simple structure, such as a pattern that is periodic in one direction, e.g., lines and spaces. Unfortunately, when the sample is complicated, such as being periodic in two different directions, modeling the sample can be difficult, time consuming and require a large amount of memory.

SUMMARY

The process of modeling a complex two-dimensional periodic structure is improved by selectively truncating the Fourier expansion used in the calculation of resulting scatter signature from the model. The Fourier expansion is selectively truncated by determining the contribution for harmonic orders in the Fourier transform of the permittivity function and retaining the harmonic orders with a significant contribution, e.g., that are above a threshold. The Fourier space may be compressed so that only the selected harmonic orders are used, thereby reducing the required memory and calculation times. The compressed Fourier space may be used in a real-time analysis of a sample or to generate a library that is used in the analysis of a sample.

BRIEF DESCRIPTION OF THE DRAWINGS

FIGS. 2A and 2B illustrate top plan views of the layers from FIGS. 1A and 1B and illustrate the two-dimensional periodicity and the non-vertical orientation of the sidewalls of each layer.

FIG. 3A is a graph illustrating the mean square error (MSE) comparing the results of truncating the Fourier space to N harmonic orders (N=12-16) versus 17 harmonic orders when performing RCWA on the sample from FIG. 1B when the sample is a 22 nm structure.

FIG. 3B, is similar to FIG. 3A, but shows the MSE comparing the results of truncating the Fourier space to N harmonic orders (N=12-20) versus 21 harmonic orders.

DETAILED DESCRIPTION

A complex sample, such as a two-dimensional periodic pattern, and its scatter signature is mathematically modeled using compression of the Fourier expansion, which retains selected harmonic orders in the Fourier space. By selecting harmonic orders for retention and eliminating other harmonic orders, the compressed Fourier space has fewer harmonic orders but retains a desired accuracy in the resulting calculation while significantly reducing the required memory and calculation time. Accordingly, with the truncated and compressed Fourier expansion, a real-time analysis of a complex two-dimensional sample is possible, or alternatively, a library may be produced in reduced time.

Figure 1A:
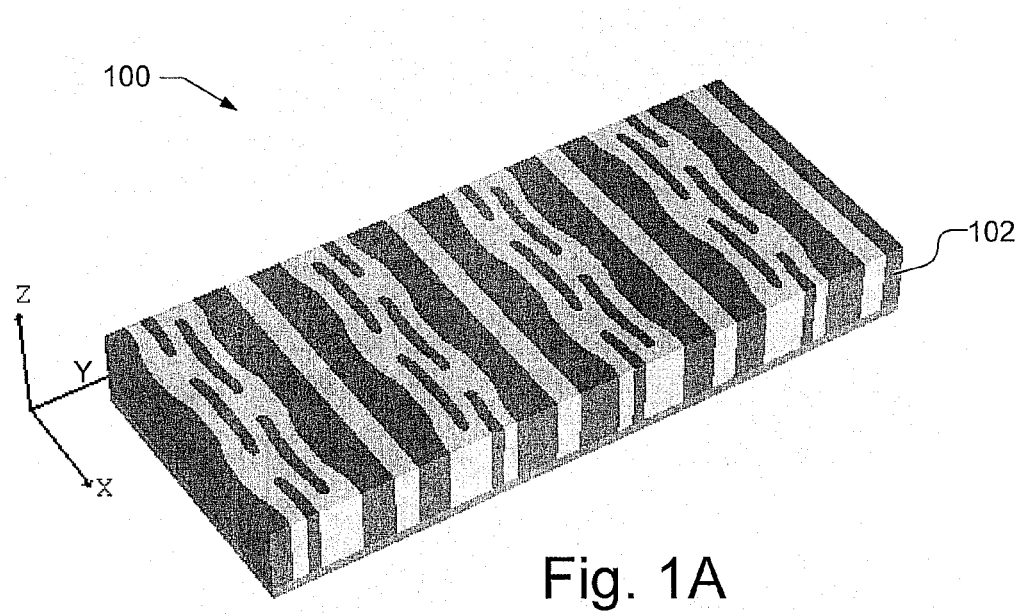
FIGS. 1A and 1B illustrate perspective views of a portion of an illustrative complex sample that is a two-dimensional periodic pattern.
Figure 1B:
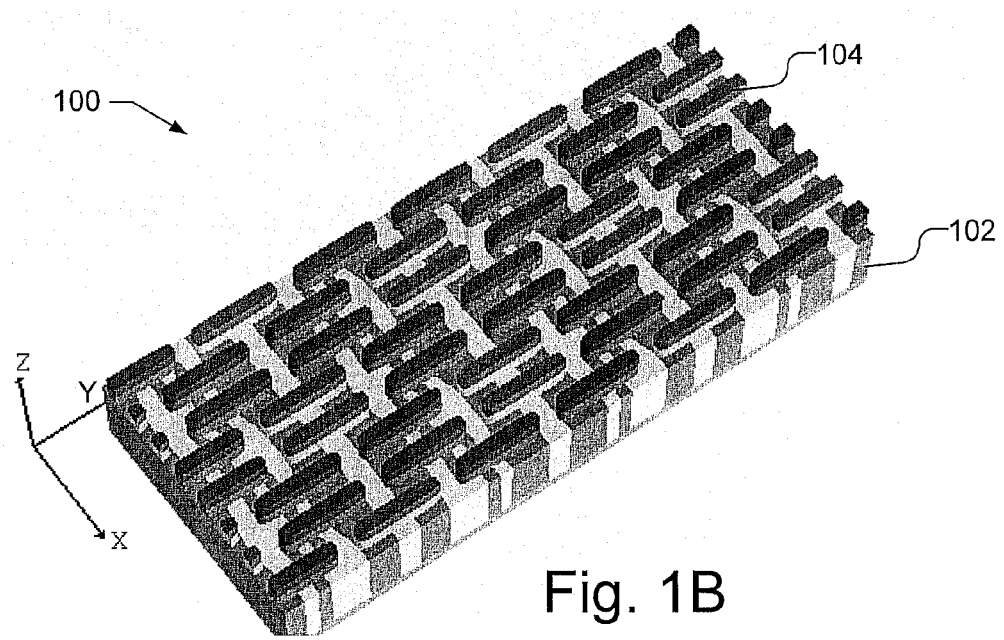

FIGS. 1A and 1B illustrate perspective views of a portion of an illustrative complex sample 100 that is a two-dimensional periodic pattern. FIG. 1A illustrates a bottom layer 102 and FIG. 1A illustrates a top layer 104 over the bottom layer 102. The sample 100 shown in FIGS. 1A and 1B may be, e.g., a portion of an SRAM device, where layer 102 in FIG. 1A is a shallow trench isolation (STI) layer, and layer 104 in FIG. 1B includes poly-silicon gates overlying the STI layer 102. As used herein, a two-dimensional pattern is a pattern that is periodic in two non-collinear directions in a top-plan view. It should be understood that the two-dimensional pattern may also include a height (or Z direction) component, e.g., the sidewalls may have a non-vertical orientation. As can be seen in FIGS. 1A and 1B, the sample 100 is periodic in two non-collinear directions, the X and Y directions, and is thus, referred to as a two-dimensional periodic pattern, despite having dimensions in a third non-collinear direction, i.e., the Z direction. By way of example, FIGS. 2A and 2B illustrate top plan views of layers 102 and 104, respectively and illustrate not only the two-dimensional periodicity of each layer, but also the non-vertical orientation of the sidewalls.

It should be understood that sample 100 shown in FIGS. 1A and 1B is merely an illustration of one type of two-dimensional periodic sample and that other two-dimensional periodic samples exist and may be modeled using the truncated and compressed Fourier space described herein.

Conventionally, the scatter signature from a two-dimensional periodic sample, such as that illustrated in FIGS. 1A and 1B, is extraordinarily difficult to model and requires a large amount of memory and calculation time. One reason for the difficulty is that the calculations require a two-dimensional Fourier transform for the dielectric function at each slice of the model and the calculation expands exponentially with the number of harmonic orders that are in the Fourier space.

Samples are modeled by forming a mathematical representation of the sample and calculating the return radiation from the sample using, e.g., a rigorous numerical method, such as Rigorous Coupled Wave Analysis (RCWA), which is sometimes known as Fourier modal method (FMM) and modal method for Fourier expansion (MMFE), or other appropriate method using Fourier expansion. For the sake of simplicity, rigorous numerical methods using Fourier expansion will be referred to herein as RCWA, but it should be understood that the present invention is not limited to use with RCWA and other Fourier expansion methods may be used. Typically, the representation of the sample, which is sometimes referred to as a mathematical model, includes multiple stacked horizontal layers, which may be referred to as slices, that permit the modeling of non-vertical sidewalls. The model is a simulation of the structure of the sample under test from which data, such as the scatter signature, can be calculated. In one non-limiting embodiment, the scatter signature is wavelength resolved. The optical model typically includes one or more variable parameters, such as layer thickness, grating linewidth, sidewall angle of the grating, and optical constants of the materials in the model. The data is calculated from the optical model using a rigorous numerical method, such as RCWA. For more information regarding RCWA, see M. G. Moharam and T. K. Gaylord, "Rigorous coupled-wave analysis of planar grating diffraction", J. Opt. Soc. Am., Vol. 71, No. 7, pp. 811-818, (1983); M. Moharam et al., "Stable implementation of the rigorous coupled wave analysis for surface-relief gratings: enhanced transmittance matrix approach," J. Opt. Soc. Am. A., Vol. 42, No. 5, pp. 1077-1086 (1995); T. Gaylord et al., "Analysis and Applications of Optical Diffraction by Gratings," Proceedings of the IEEE, Vol. 73, No. 5, pp. 894-937 (1985), N. Chateau and J. P. Hugonin, "Algorithm for the rigorous coupled-wave analysis of grating diffraction," J. Opt. Soc. Am. A, Vol. 41, No. 4, April 1994, pp. 1321-1331; and M. G. Moharam et. al., "Formulation for stable and efficient implementation of the rigorous coupled-wave analysis of binary grating," J. Opt. Soc. Am. A, Vol. 42, No. 5, May 4995, pp. 1068-1076, which are incorporated herein by reference.

Rigorous numerical methods using Fourier expansion, such as RCWA, process can generally be divided into three stages. First, the coupled-wave equations, i.e., the eigenproblems, for each model layer are constructed and solved. If desired, rather than solving the eigenproblem for each layer, a finite difference calculation may be performed and propagated for each layer. The truncation and compression of the Fourier space, described herein, occurs in the construction of the eigenproblems. Second, the electromagnetic fields at each layer interface, starting with the bottom and moving up to the bottom interface at the top layer, are matched. Finally, the field matching condition at the top interface of the top layer is solved.

During the construction of the eigenproblems, the permittivity function (sometimes referred to as the dielectric function) is expanded in a Fourier series. The matrix E' of the Fourier coefficients for the dielectric function of the layer is constructed as $E_{i,j} = \tilde{\varepsilon}_{|i-j|}$. The Fourier series is an infinite series, and thus, truncation of the harmonic orders in the Fourier space is necessary. Accuracy of the calculated data, however, requires the retention of a large number of harmonic orders.

One method of truncating the Fourier space is using a large, but arbitrary number of harmonic orders. For example, the Fourier space may be truncated to 14 to 21 harmonic orders. FIG. 3A is a graph illustrating the mean square error (MSE) comparing the results of truncating the Fourier space to N harmonic orders (N=12-16) versus 17 harmonic orders when performing RCWA on the sample 100 shown in FIG. 1B when the sample is a 22 nm structure. The fit for the results may be considered good when the MSE is below, e.g., 0.25. As can be seen in FIG. 3A, a good correlation with the results based on 17 harmonic orders is achieved with a minimum of 14 harmonic orders. FIG. 3B, however, illustrates the lack of convergence of a solution. FIG. 3B, is similar to FIG. 3A, but shows the MSE comparing the results of truncating the Fourier space to N harmonic orders (N=12-20) versus 21 harmonic orders. As can be seen in FIG. 3B, using only 14 harmonic orders no longer provides a good fit when compared to the results produced using 21 harmonic orders. Moreover, as can be seen, only the use of 20 harmonic orders is considered a good fit compared to the resulted produced using 21 harmonic orders. Thus, the solution may not converge.

Further, while using a large number of harmonic orders is desirable for accuracy, the use of a large number of harmonic orders requires a substantial amount of resources. During a Fourier expansion process, such as RCWA, both the negative and positive harmonic orders are explicitly treated. As a result, if, for example, 21 harmonic orders are retained in the full expansion, 43 harmonic orders are actually calculated (zeroth order+21 negative orders+21 positive orders). Consequently, in this example, in a full RCWA process, the matrices will be 43 by 43 square matrices. The time required to perform the full calculation is dominated by a single matrix eigenvalue calculation for each layer of the model and, e.g., at each wavelength, if the measurement is wavelength resolved, as well as numerous matrix multiplications. Both of these operations, e.g., calculation of each matrix and the multiplication of multiple matrices, require at least $N^3$ floating point operations, and thus, require substantial time and memory to calculate. Thus, the RCWA calculation expands exponentially with the number of harmonic orders that are in the Fourier space.

Another method of truncating the Fourier space is based on an a geometric scheme, e.g., by retaining a finite number of harmonic orders that fall within a certain area in the Fourier space centered on the zeroth order. For example, known truncation schemes include using only the harmonic orders that are located within parallelogramic or circular areas centered on the origin of the Fourier space. For more information related to geometric truncation schemes, see Li, "New formulation of the Fourier modal method for crossed surface-relief gratings", J. Opt. Soc. Am. A/Vol. 14, No. 10, (October 2007) p. 2758-2767, which is incorporated herein by reference. The geometries scheme, however, arbitrarily includes harmonic orders that are within the selected geometric space regardless of the harmonic orders contribution to the final result, again resulting in operations that require substantial time and memory to calculate.

Figure 4:
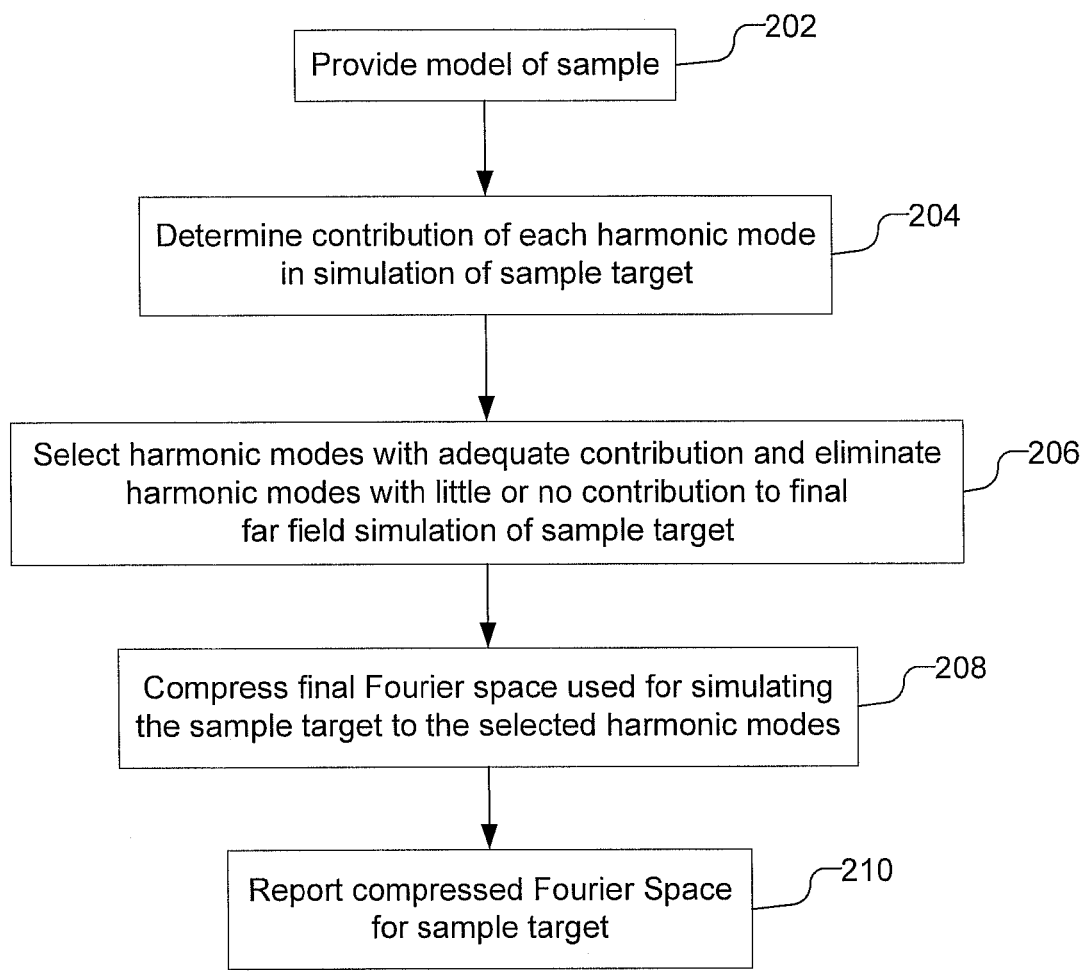
FIG. 4 illustrates a process of compressing the Fourier space by selecting the harmonic orders that are retained in the Fourier space and eliminating the other harmonic orders.

FIG. 4 illustrates a process of compressing the Fourier expansion by selecting the specific harmonic orders to be retained in the Fourier space. As illustrated in FIG. 4, a mathematical representation, i.e., model, of the sample is provided (block 202). The eigenproblem for each layer of the model is generated using a desired number of harmonic orders, e.g., 21 harmonic orders, from which the contribution of each harmonic order is determined (block 204). The harmonic orders with an adequate contribution to the final result are selected for retention and the remaining harmonic orders, i.e., those with little or no contribution to the final far field simulation of the sample, are eliminated (block 206). By way of example, an adequate contribution from a harmonic order may be determined based on the absolute value of the normalized harmonic order being above a selected threshold value and inversely, a harmonic order of little or no contribution is below the threshold value. The final Fourier space for each slice in the model may then be compressed to include only the selected harmonic orders (block 208) and reported by storing in memory (block 210). The stored results may then be provided to be used in an optical metrology system that measures a physical sample.

For a structure that has non-vertical sidewalls, e.g., the sample 100 shown in FIGS. 1A and 1B, the selection of harmonics orders in the Fourier space is performed for each slice. The final compressed Fourier space is constructed by retaining all harmonic orders from all slices. In other words, the final compressed Fourier space for each slice has the same harmonic orders, which includes any harmonic order that was selected for any slice. For example, if a harmonic order designated as $E_{1,2}$ is selected for slice 1 and harmonic order designated as $E_{3,4}$ is selected for slice 2, then the final compressed Fourier space for every slice, including slice 1 and slice 2 includes both harmonic orders $E_{1,2}$ and $E_{3,4}$. Various adaptations and modifications may be made to the way of constructing the final Fourier space from different slices. For example, in another embodiment, rather than applying a threshold to the harmonic orders in the Fourier space for each slice, an average matrix is generated for the full Fourier transform matrices from all slices and a threshold is applied to the absolute value of each harmonic order of the averaged Fourier transform matrix. The retained harmonic orders for the averaged Fourier transform matrix may then be used as the final compressed Fourier space for each individual slice.

The compressed Fourier space thus has less harmonic orders than a full, i.e., non-compressed, Fourier space that has the same truncation scheme. By way of example, the compressed Fourier space may have half or less of the harmonic orders of a non-compressed Fourier space that has the same truncation scheme.

The compressed Fourier space can then be used, as discussed above, to calculate the electromagnetic fields at each layer interface or to calculate and propagate a finite difference. The field matching condition at the top interface of the top layer can then be solved. Because the compressed Fourier space includes only selected harmonic orders that significantly contribute to the final solution, the required time and memory to calculate the electromagnetic fields at each layer interface or to calculate and propagate a finite difference is significantly reduced compared to the use of Fourier spaces conventionally truncated using, e.g., an arbitrary number of harmonic orders or a geometric scheme. The compressed Fourier space may be used to perform a real-time analysis or to generate a library.

It should be understood that the compressed Fourier space is generated for a specific sample and is valid for normal process variations in parameters of the sample. For a different type of sample or for a similar sample with significant variations in parameters, a different compressed Fourier space may need to be determined.

Figure 5:
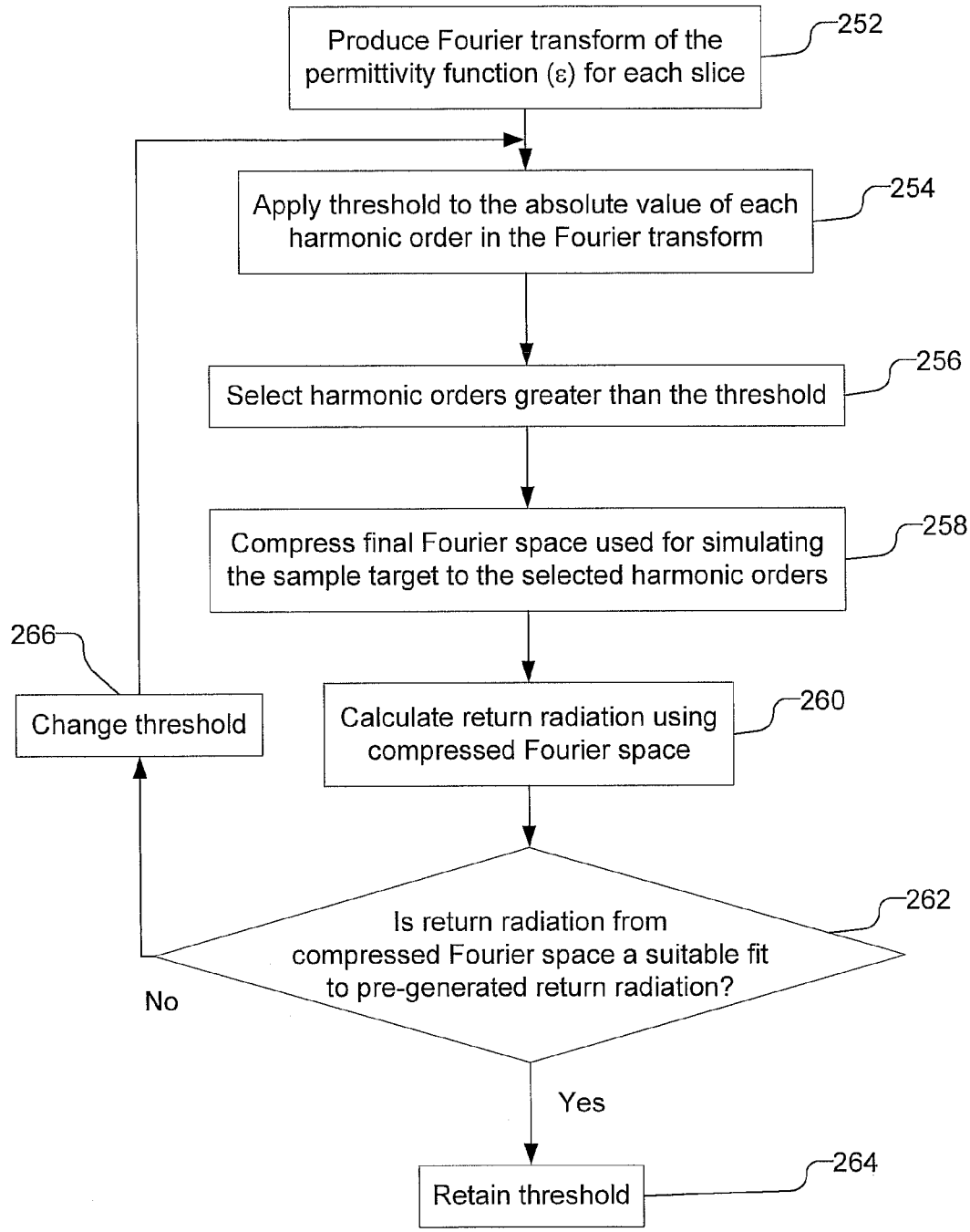
FIG. 5 illustrates determining the contribution of each harmonic order and selecting harmonic orders with an adequate contribution.

FIG. 5 illustrates one embodiment of generating a threshold that may be used to select harmonic orders with an adequate contribution to the final far field simulation of a sample. If desired, the threshold may be generated in other ways. As illustrated in FIG. 5, the Fourier transform of the dielectric (sometimes referred to as permittivity) function is produced (block 252), which is in the form of a matrix $E_{i,j}$ which is constructed as $E_{i,j} = \overline{\in}_{|i-j|}$. The elements of the matrix $E_{i,j}$ are normalized resulting in a matrix that may be illustrated as:

$$E = \begin{bmatrix} 1 & 0.99 & 0.023 & \ldots & 0.73 \\ 0.98 & 1 & 0.14 & \ldots & 0.025 \\ 0.026 & 0.044 & 1 & \ldots & 0.64 \\ \ldots & \ldots & \ldots & \ldots & 0.048 \\ .0016 & 0.034 & 0.043 & 0.98 & 1 \end{bmatrix}. \quad \text{eq. 1}$$

A threshold is selected and applied to the absolute value of each harmonic order in the matrix (block 254), where harmonic orders greater than the threshold are retained and the remaining orders are eliminated (block 256). Thus, for example, with the matrix shown in equation 1, above, a threshold of 0.05 may be applied, resulting in the following matrix, where elements indicated by zero are eliminated.

$$E = \begin{bmatrix} 1 & 0.99 & 0 & \ldots & 0.73 \\ 0.98 & 1 & 0 & \ldots & 0 \\ 0 & 0.44 & 1 & \ldots & 0.64 \\ \ldots & \ldots & \ldots & \ldots & 0 \\ 0 & 0 & 0 & 0.98 & 1 \end{bmatrix}. \quad \text{eq. 2}$$

The Fourier space can then be compressed by eliminating the non-selected harmonic orders (block 258). The return radiation for the model is then calculated using a rigorous numerical method, e.g., RCWA, with the compressed Fourier space for each slice of the model (block 260). The return radiation calculated using the selected harmonic orders in the compressed Fourier space is compared to return radiation that is conventionally generated, e.g., using all the harmonic orders in the Fourier space, or alternatively, measured empirically (block 262). If the return radiation calculated using the compressed Fourier space is an adequate fit to the conventionally generated return radiation (block 262), then the threshold is retained (block 264), e.g., by storing in memory. If, on the other hand, the return radiation calculated using the compressed Fourier space is not an adequate fit to the conventionally generated return radiation (block 262), then the threshold value for the harmonic orders is changed (block 266) and the process repeats until an adequate fit is achieved and the new threshold is retained. The retained threshold may then be used to select harmonic orders to be retained or eliminated (block 206 in FIG. 4).

Figure 6:
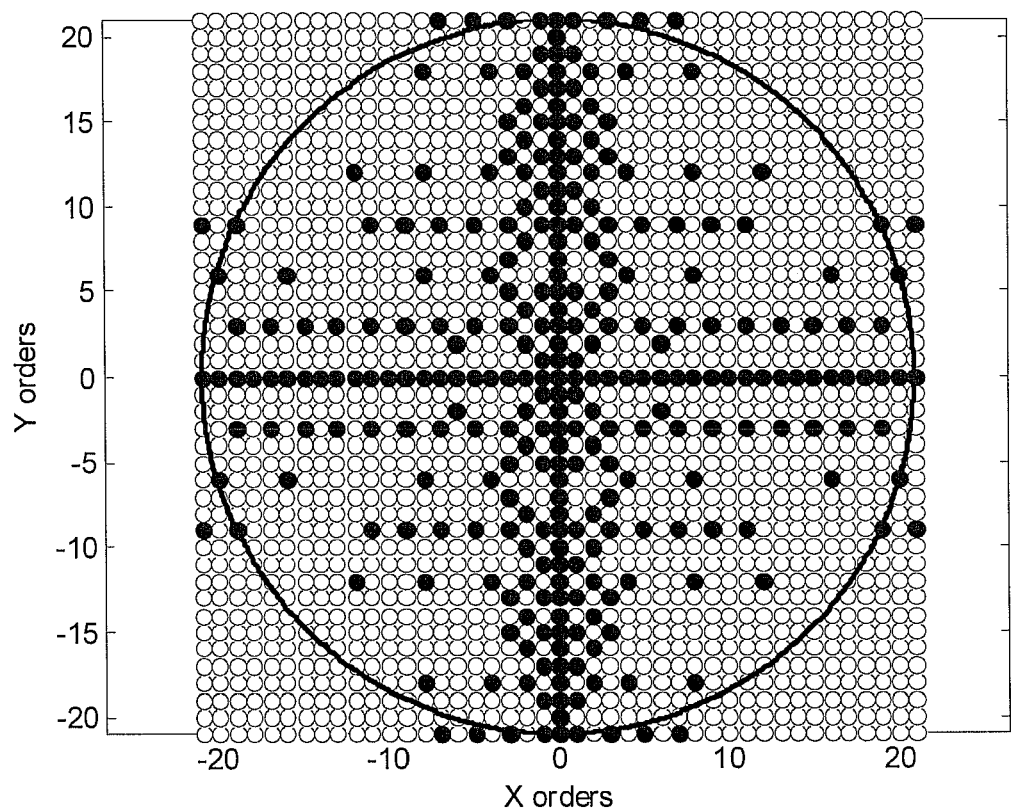
FIG. 6 is a graph illustrating selected harmonic orders in a 21 harmonic order Fourier space.

FIG. 6 is a graph illustrating selected harmonic orders in a 21 harmonic order Fourier space. As can be seen in FIG. 6, with 21 harmonic orders, the Fourier space includes 21 positive and 21 negative harmonic orders and the zeroth harmonic order to produce a 43×43 harmonic order space. Thus, using the full 21 harmonic orders results in a total of 1849 harmonic orders within the Fourier space. FIG. 6 illustrates the harmonic orders that are selected using a threshold of 0.05 with solid spots and the empty spots are the unselected harmonic orders.

Figure 7:
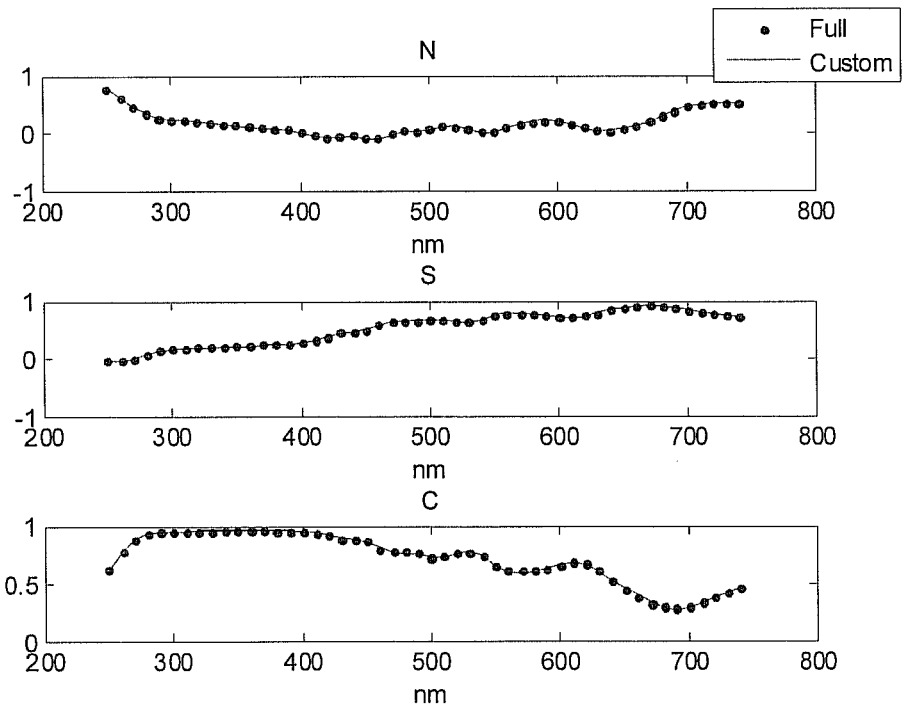
FIG. 7 is a graph illustrating a calculated spectral response using a full 21 harmonic order Fourier space and the selected truncated Fourier space illustrated in FIG. 6, for the sample shown in FIG. 1B.

FIG. 7 is a graph illustrating a calculated spectral response using a full 21 harmonic order Fourier space and the selected truncated Fourier space illustrated in FIG. 6, for the sample 100 shown in FIG. 1B. The N, S, and C quantities in FIG. 7 describe how a sample changes the polarization state of light and are derived from the ellipsometric $\psi$ & $\Delta$; N=$\cos(2\psi)$, S=$\sin(2\psi)\sin(\Delta)$ & C=$\cos(2\psi)\cos(\Delta)$. As can be seen, the spectral response for the selected truncated Fourier space closely agrees with the full Fourier space. Moreover, due to the limited number of harmonic orders that are used, the RCWA calculation using the selected harmonic orders is 28× faster and require less than a third of the memory than calculations performed using the full harmonic orders.

Figure 8:
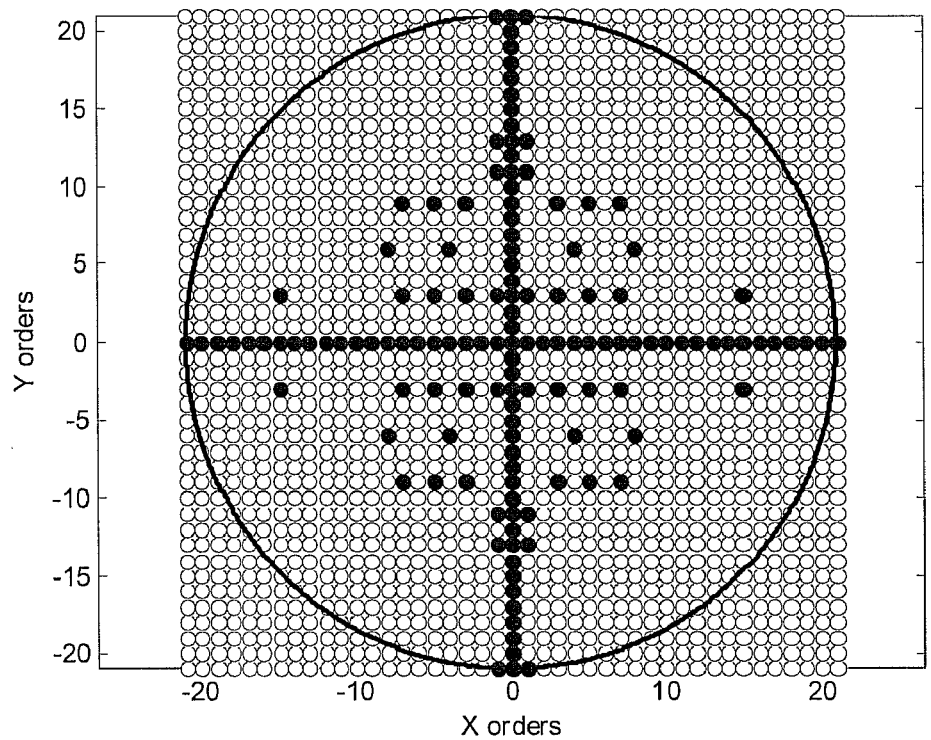
FIG. 8 is a graph similar to FIG. 6, but with the harmonic orders selected based on a threshold of 0.1.

FIG. 8 is a graph similar to FIG. 6, but with harmonic orders selected based on a threshold of 0.1. As can be seen in FIG. 8, a higher threshold further reduces the number of harmonic orders in the Fourier space.

Figure 9:
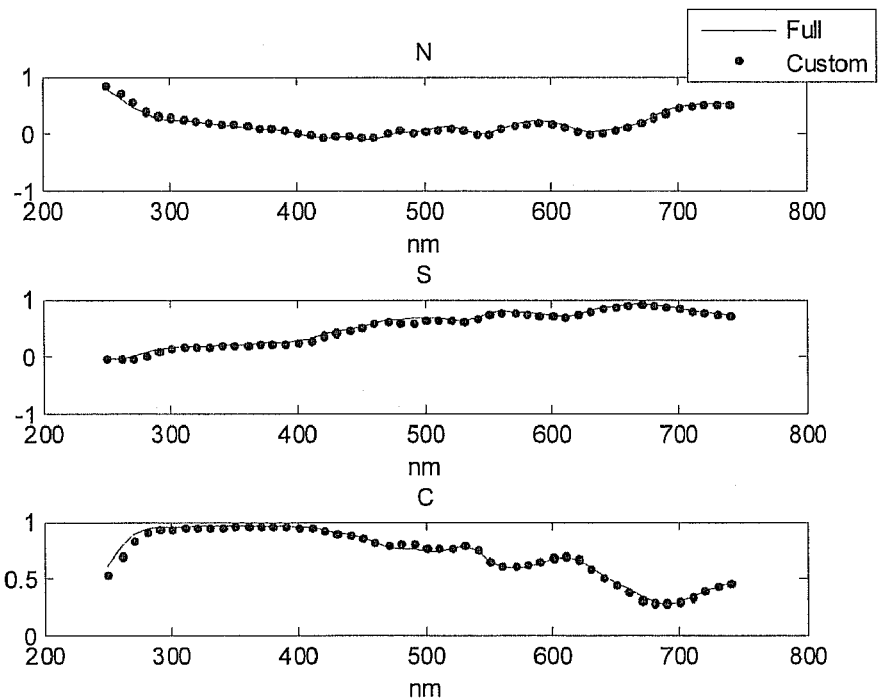
FIG. 9 is a graph, similar to FIG. 7, but based on the harmonic orders illustrated in FIG. 8.

FIG. 9 is a graph, similar to FIG. 7, but based on the harmonic orders illustrated in FIG. 8. As can be seen in FIG. 9, the spectral response for the selected truncated Fourier space still closely agrees with the full Fourier space. However, due to the significantly reduced number of harmonic orders in the Fourier space, the calculation is 150× faster and requires less than $\frac{1}{10}$ of the memory used for performing calculations with the full number of harmonic orders.

Thus, it can be seen that the selective elimination of harmonic orders to form a compressed Fourier space significantly reduces the calculation time and memory requirements while providing results that closely match the results from calculations that use the full, non-compressed Fourier space.

Figure 10:
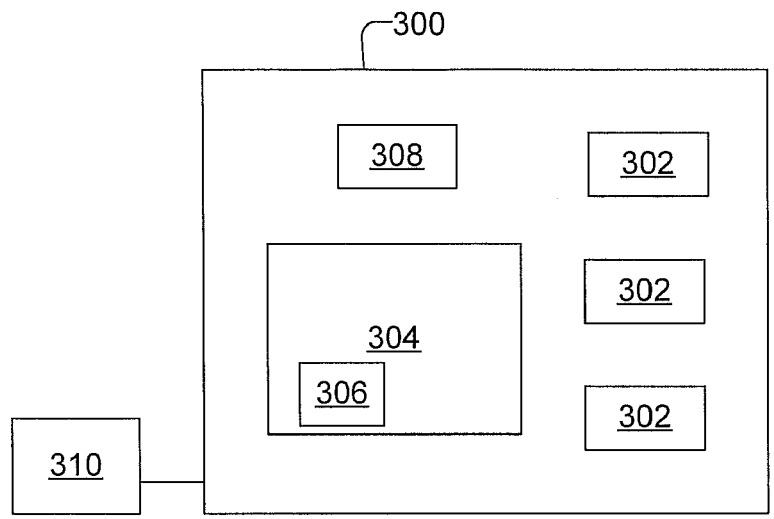
FIG. 10 illustrates a library that may be produced using a computer system and the compressed Fourier space.

In one embodiment, a library of pre-calculated diffraction signals, each being associated with one or more different variable parameters of the sample, can be generated using the compressed Fourier space. FIG. 10, by way of example, illustrates a library 310 that may be produced using a computer system 300. The computer system 300 may be used to select the harmonic orders to be retained and produce a compressed Fourier space, as described, as well as the necessary calculations using the compressed Fourier space to generate the library.

The computer system 300 may include multiple processors 302, which may be configured to perform portions of the computations in parallel. If desired, however, the computer system 300 can be configured to use a single processor 302. The computer system 300 further includes memory 304 that is configured with a large amount of memory, such as 32 Gigabytes or more, that can be accessed by the multiple processors 302. The computer system 300 may be configured with any number and size of memories 304. Further, if desired, cache 306 may reside in memory 304. The cache may be used to store blocks of hypothetical layers and hypothetical profiles to be more quickly accessed by the processors 302. The computer system 300 may also include a user interface 308.

The library 310 that is produced by the computer system 300 may be stored on various computer-readable storage media, such as magnetic and optical storage devices such as disk drives, magnetic tape, compact discs, and DVDs (digital versatile discs or digital video discs). The library 310 may be written by the computer system 300 to the desired storage media, which is then read by an appropriate signal processing module in the metrology device during use.

The measurement of the sample relies on modeling the sample and calculating the optical response, e.g., scatter signature, from the model, which is compared to the acquired scatter signature. Modeling and calculating optical responses from the model when the sample is a relatively simple one-dimensional pattern (e.g., the pattern is periodic in one direction) is well known and described in detail in U.S. Pat. No. 6,898,537 and U.S. Pat. No. 7,115,858, which are incorporated herein by reference. When the sample under test, however, is a complex pattern, such as a two-dimensional pattern (e.g., the pattern is periodic in two non-collinear directions), modeling and calculating the response from the model is more difficult, as discussed above. Accordingly, the compressed Fourier space may be used to reduce the calculation time and memory required to perform a real-time analysis or to generate the library.

Figure 11:
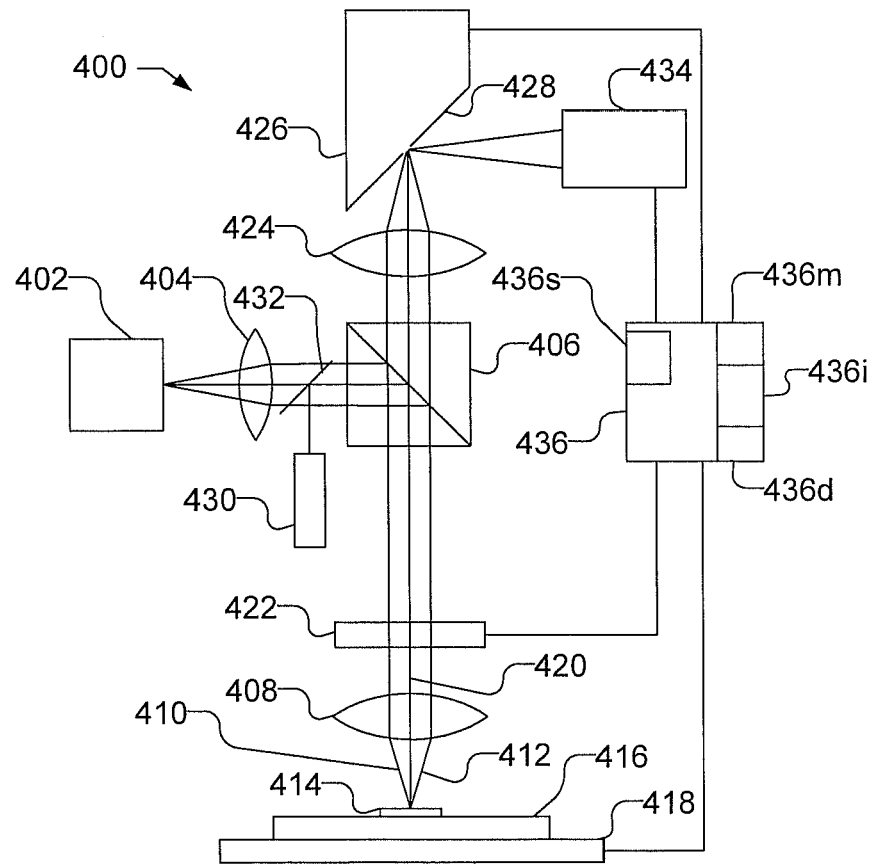
FIG. 11 is a schematic diagram of a metrology device that may measure a complex two-dimensional periodic structure in real-time or using a library based on the compressed Fourier space.

FIG. 11 is a schematic diagram of a metrology device 400 that may measure a complex diffracting structure using the library 310 produced using the compressed Fourier space as described above. Alternatively, the metrology device 400 may use the compressed Fourier space to process the measurements in real-time. The metrology device shown in FIG. 11 is a normal incidence reflectometer 400, but it should be understood that the present invention is not limited to any particular metrology device. Any metrology device may use a model produced using the compressed Fourier space as described above, e.g., either in a library or in real time analysis.

The normal incidence reflectometer 400 shown in FIG. 11, includes a broadband light source 402, such as an UV-visible light source with wavelengths, e.g., between 200 nm to 800 nm, that produces unpolarized light. The unpolarized light is collected and collimated by lens 404. Beamsplitter 406 directs a portion of the collimated, broadband, unpolarized light beam toward the sample that is held on a movable sample stage 418. The sample may be, e.g., a diffraction grating structure 414 on a patterned silicon wafer 416. It should be understood, of course, that grating structure 414 is typically very small and that its size shown in FIG. 11 is exaggerated for the sake of clarity.

Disposed between the beamsplitter 406 and the sample 414 is a polarizing element such as a rotatable analyzer/polarizer ("RAP") 422. The light reflected by beamsplitter 406 toward the sample passes through the RAP 422 and is linearly polarized. The rotation of RAP 422 is controlled by a computer 436. Controlling the rotation of a polarizer is within the abilities of those skilled in the art. In another embodiment, RAP 422 is stationary while computer 436 rotates sample stage 418 so that the grating structure 414 is rotated relative to RAP 422.

The RAP 422 passes only the electric field component of the light that is coincident with the polarization axis of the RAP 422 and thus controls the orientation of the light that is incident on the sample. The RAP 422 may be, e.g., Glan Taylor air-spaced polarizer, a dichroic Polaroid sheet, or any other appropriate linearly polarizing device. The light from RAP 422 is focused by objective 408 so that the light is normally incident on grating structure 414. While marginal rays 410 and 412 are at small angles from the normal ray 420 on the sample, the angles are too small to see any polarization effects that occur in conventional ellipsometers. Because RAP 422 is rotated relative to the diffraction structure 414, i.e., RAP 422 and/or diffraction structure 414 is rotated, the polarization orientation of the incident light need not be aligned with the grating of the diffraction structure 414 prior to the metrology process. Consequently, normal incidence reflectometer 400 may be used, advantageously, with a wafer stage 418 that is capable of any or all of x, y, z, and/or θ movement, as well as a stage that is capable of r-θ-z movement only.

Diffracted light from the grating structure 414 is re-collimated by lens 408 and passes through the RAP 422, which linearly polarizes the light. The light has an electric field component that is either parallel (sometimes called TE or S-polarization) or perpendicular (sometimes called TM or P-polarization) to the lines of the grating structure 414. The light that is diffracted from grating structure 414 will have a different electric field component intensity and phase than the light that is incident on the structure 414. The RAP 422 passes only the electric field component of the reflected beam that is coincident with the polarization axis of the RAP 422. Thus, RAP 422 advantageously permits detection of different spectral components of the diffracted light.

The light then passes through the beamsplitter 406. The light is then focused by lens 424 to the entrance slit of a spectrometer 426. In an another embodiment, lens 408 may be replaced with a microscope objective and lens 424 removed. Spectrometer 426 may be a conventional CCD, PDA, or similar type spectrograph that disperses the full spectrum of the polarized light into spectral components across an array of detector pixels. Each pixel corresponds to a different wavelength, and thus the spectrometer 426 generates a spectrograph signal, $S(\lambda)$, as a function of wavelength $\lambda$ that is transmitted to computer 436. The signal $S(\lambda)$ is corrected for electronic background as is well known in the art. Because the RAP 422 is rotated through a discrete set or continuous set of angles, $\Theta$, from 0 to 360 degrees, the signal $S(\lambda)$ is also a function of angle, $S(\lambda, \Theta)$.

The sample may be viewed and aligned using, e.g., a lamp 430 that produces visible light to provide flood illumination via movable mirror 432. This flood illumination is reflected off mirror 428 to a camera and pattern recognition system 434, which may be coupled to computer 436. The pattern recognition system 434 can provide a measure of orientation of grating structure 414 relative to the RAP 422, if desired, as well as serve as a conventional detector for the sample height. The pattern recognition system 434 provides data to the computer 436, which accordingly adjusts the height of stage 418.

The data acquired, including the spectral information from spectrometer 426 as well as the image information from pattern recognition system 434, is received by the computer 436 and stored in memory 436*m*. The computer 436 includes a computer-usable medium 436*i* having computer-readable program code embodied therein for causing the computer to control the normal incidence reflectometer 400 and to perform a desired analysis, as described herein. The data structures and software code for automatically implementing one or more acts described in this detailed description can be implemented by one of ordinary skill in the art in light of the present disclosure and stored on a computer readable storage medium, which may be any device or medium that can store code and/or data for use by a computer system such as computer 436. The computer-usable medium 436*i* may be, but is not limited to, magnetic and optical storage devices such as disk drives, magnetic tape, compact discs, and DVDs (digital versatile discs or digital video discs). When the metrology device 400 uses the library 310, described above, the computer 436 also includes a storage module 436*s* for holding and reading the library 310. If desired, the metrology device 400 may perform a real-time analysis, and thus, the storage module 436*s* would not read the library 310. The computer 436 may report the results of the analysis, e.g., by storing the results in memory 436*m* or storage 436*s* and/or displaying the results on a display 436*d*.

The normal incidence reflectometer 400 operates in a manner similar to a reflectometer but includes the RAP 422 and uses a relative rotation of the sample, i.e., grating structure 414, and the RAP 422; either RAP 422, sample support 418 or both are rotated. Because components of the normal incidence reflectometer 400, such as beamsplitter 406 and spectrometer 426, have polarization dependent efficiencies, multiple calibrations are performed so that a plurality of orientations of the RAP 422 with respect to the diffraction grating structure 414 are measured relative to some arbitrary machine fiducial. Conventional reflectometers, on the other hand, require only a single calibration and do not use polarizer/analyzer.

The calibration and operation of the normal incidence reflectometer 400, including acquiring data and extracting spectral information from the acquire data, along with other aspects, is described in detail in U.S. Pat. No. 6,898,537, which is incorporated herein by reference.

Figure 12:
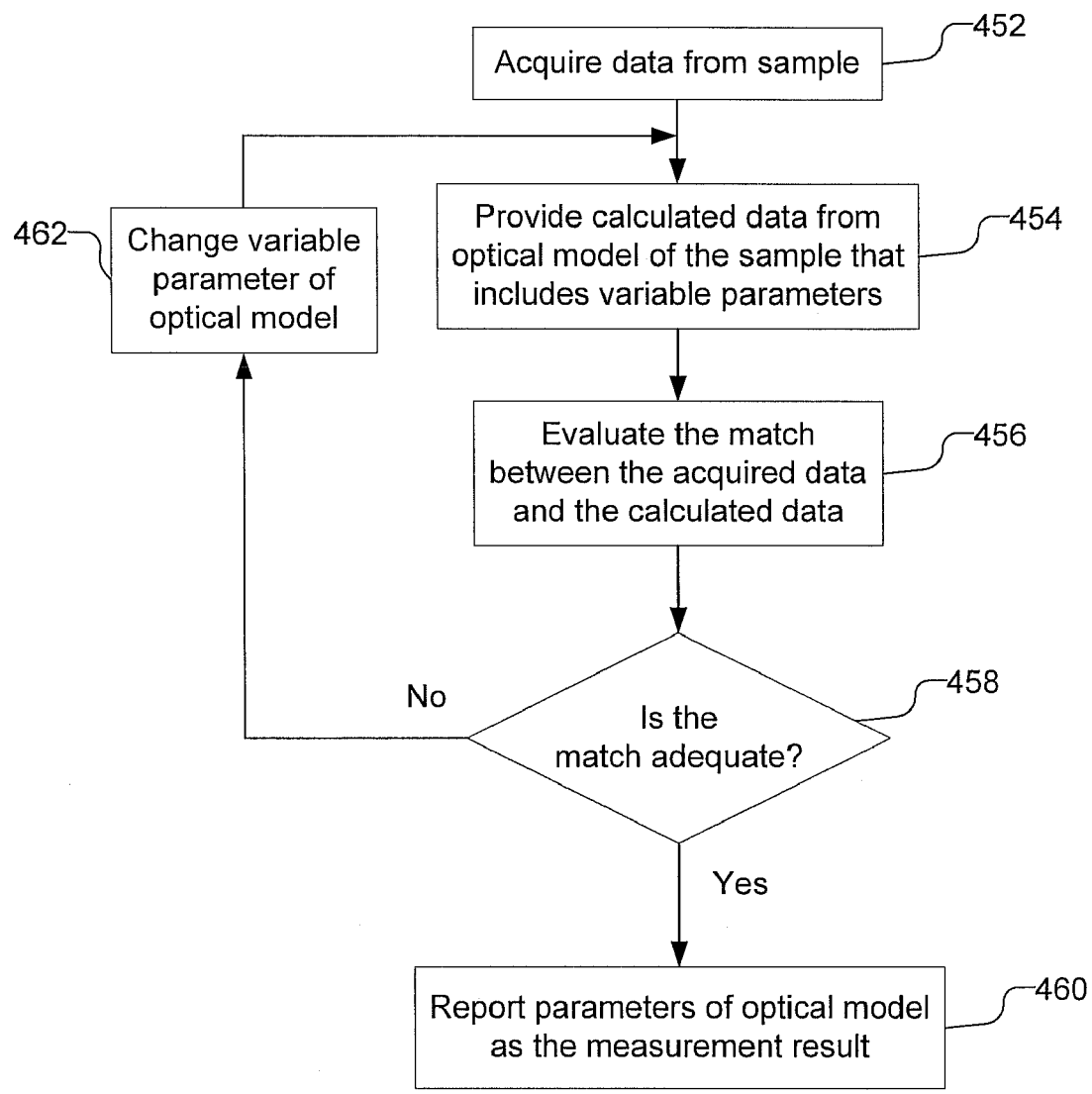
FIG. 12 is a flow chart of measuring a sample using an optical metrology instrument.

FIG. 12 is a flow chart of measuring a sample using an optical metrology instrument, such as that shown in FIG. 11 above. As illustrated, data in the form of a scatter signature is acquired from the sample (block 452). To acquire data from the sample, the sample is placed on a stage and illuminated with an incident beam. With the use of normal incidence reflectometer 400, the incident beam is polarized by the RAP 422, which may be rotated over the discrete (or continuous) set of angles from 0 to 360 degrees or, alternatively, the stage 418 may be rotated. The spectrometer 426 receives the returned light after it interacts with the sample, passes through the RAP 422 and beamsplitter 406. The spectrometer 426 provides to the computer 436 a raw scan $S_S(\lambda, \Theta)$ signal of the sample for each position, $\Theta$, of the RAP 422 and the computer 436 calculates a sample reflectance $R_S(\lambda, \Theta)$ for each position of the RAP 422. The sample reflectance $R_S(\lambda, \Theta)$ may then be processed to extract spectral data, e.g., $R_{TM}(\lambda)$, $R_{TE}(\lambda)$, and $\cos \Delta$. It should be understood that other types of metrology instruments may be used in place of the normal incidence reflectometer 400, in which case the acquired data may be in a different form than the spectral data $R_{TM}(\lambda)$, $R_{TE}(\lambda)$, and $\cos \Delta$.

Data, e.g., the scatter signature, that is calculated from a model of the sample is provided (block 454) and the match between the acquired data and the calculated data is evaluated (block 456). The calculated data may be provided from, e.g., the library 310 or by calculating the data in real-time using the compressed Fourier space as described above. In one embodiment, a hybrid approach may be used, where a library 310 is initially used to determine an approximate match and a real-time analysis is used to refine the results.

The match between the acquired data and the calculated data may be evaluated (block 456) using, e.g., the Mean-Squared Error (MSE) between the acquired and the calculated data. If the acquired data points are denoted as $y_a(\lambda_I)$ and the calculated data points are denoted as $y_c(\lambda_I)$, then the MSE is given by:

$$MSE = \sum \frac{(y_a(\lambda_1) - y_c(\lambda_1))^2}{N - M} \qquad \text{eq. 3}$$

Where N is the total number of data points and M is the total number of variable parameters in the model. Note that if the acquired data and calculated data are identical, the MSE value is zero. The smaller the value of the MSE, the better the match between the acquired data and calculated data. If the match between the acquired data and the calculated data is adequate (block 458), e.g., less than a threshold value, then the optical model that corresponds to the calculated data is presumed to accurately simulate the sample under test and the parameters of the optical model are reported as the measurement result (block 460). For example, the computer 436 may report the results of the analysis, e.g., by storing the results in storage 436*m* and/or displaying the results on a display 436*d*.

If the match between the acquired data and the calculated data is not adequate (block 458), a different set of calculated data is provided (block 454) based on an optical model that has a different variable parameter (block 462). The process of changing the variable parameter of the optical model and providing calculated data that corresponds to the different optical model may be performed with a library, e.g., by looking up a different set of calculated data in the library that corresponds to a different optical model, or with a real-time calculation, e.g., using the Levenberg-Marquardt algorithm. Once an adequate match between the acquired data and the calculated data is achieved, the parameters of the optical model are reported as the measurement result (block 460) by storing in memory in order to display the result or to otherwise use the result, e.g., to save for future analysis or to make a determination of whether to accept or reject the sample.

It should be understood that the optical metrology instrument illustrated in FIG. 12 is merely one example of a scatterometer that may utilize the compressed Fourier space in a real-time analysis or by using a library that itself was generated using a compressed Fourier space. Of course, other types of optical metrology instruments including normal incidence, oblique incidence, reflectometer, ellipsometer, etc. may be utilize the compressed Fourier space as described herein.

Although the present invention is illustrated in connection with specific embodiments for instructional purposes, the present invention is not limited thereto. Various adaptations and modifications may be made without departing from the scope of the invention. Therefore, the spirit and scope of the appended claims should not be limited to the foregoing description.

What is claimed is:

1. A computer implemented method comprising:
   providing a model of a two-dimensional periodic sample to a computer, the model having at least one variable parameter;
   calculating with the computer the response of the two-dimensional periodic sample to incident light using the model and a two dimensional truncated and compressed Fourier space, the two-dimensional truncated and compressed Fourier space having less than all the harmonic orders of a non-compressed two-dimensional Fourier space having the same truncation; and
   storing in the computer the calculated response of the two-dimensional periodic sample to incident light in memory.

2. The method of claim 1, wherein the harmonic orders that are included in the two dimensional truncated and compressed Fourier space are harmonic orders that are selected based on contributions provided by the harmonic orders to a final far field simulation of the two-dimensional periodic sample.

3. The method of claim 2, wherein the contributions provided by the harmonic orders is determined by comparing a threshold value to the harmonic orders in the non-compressed two-dimensional Fourier space having the same truncation.

4. The method of claim 1, further comprising calculating the response of the two-dimensional periodic sample to incident light using the model with a plurality of different values of at least one variable parameter and storing the calculated responses of the two-dimensional periodic sample to incident light for the plurality of different values of the at least one variable parameter in memory, wherein the memory is a library.

5. The method of claim 1, further comprising comparing the stored calculated response to a measured response from a physical sample.

6. The method of claim 5, further comprising:
   calculating a different response of the two-dimensional periodic sample to incident light using the model with a different value of at least one variable parameter and the two dimensional truncated and compressed Fourier space;
   storing the calculated different response of the two-dimensional periodic sample to incident light in memory; and
   comparing the stored calculated different response to the measured response from the physical sample.

7. The method of claim 1, wherein the two-dimensional Fourier space is a Fourier transform of the permittivity function.

8. The method of claim 1, wherein the model comprises a plurality of slices, and wherein the two dimensional truncated and compressed Fourier space is used for each slice.

9. The method of claim 1, wherein the two-dimensional truncated and compressed Fourier space includes half or less of the harmonic orders that are in a non-compressed two-dimensional Fourier space having the same truncation.

10. The method of claim 1, further comprising providing the calculated response to be used in an optical metrology system that measures a physical sample.

11. A method comprising:
    producing with a light source light that is incident on a two-dimensional periodic sample;
    detecting with a light detector diffracted light from the two-dimensional periodic sample;
    extracting with a computer information from the diffracted light;
    providing to the computer calculated information that is calculated using a model of the two-dimensional periodic sample and a rigorous numerical method that uses a compressed two-dimensional Fourier space with less harmonic order than in a non-compressed two-dimensional Fourier space formed using the same truncation as the compressed two-dimensional Fourier space;
    comparing with the computer the calculated information to the extracted information to determine parameters of the two-dimensional periodic sample; and
    storing in the computer the determined parameters of the two-dimensional periodic sample in memory.

12. The method of claim 11, wherein the produced light has a plurality of wavelengths.

13. The method of claim 11, wherein providing to the computer calculated information comprises the computer retrieving the calculated information from a library.

14. The method of claim 11, wherein providing to the computer calculated information comprises calculating with the computer the calculated information in real-time.

15. The method of claim 14, wherein the model of the two-dimensional periodic sample has at least one variable parameter, the method further comprising repeatably adjusting the at least one variable parameter in the model, providing calculated information for the adjusted model and comparing the calculated information to the extracted information until an acceptable fit occurs.

16. The method of claim 11, wherein the two-dimensional Fourier space is a Fourier transform of the permittivity function.

17. The method of claim 11, wherein the model comprises a plurality of slices, and wherein the compressed two-dimensional Fourier space is used for each slice.

18. The method of claim 11, wherein the harmonic orders that are included in the two dimensional compressed Fourier space are harmonic orders that are selected based on contributions provided by the harmonic orders to a final far field simulation of the two-dimensional periodic sample.

19. The method of claim 18, wherein the contributions provided by the harmonic orders is determined by comparing a threshold value to the harmonic orders in the non-compressed two-dimensional Fourier space having the same truncation.

20. An apparatus for measuring one or more parameters of a two-dimensional periodic sample, the apparatus comprising:
a radiation source that emits radiation that is incident on and diffracted by the two-dimensional periodic sample;
at least one photodetector that detects the radiation diffracted by the two-dimensional periodic sample; and
a computer system connected to the at least one photodetector for analyzing the detected radiation, said computer system comprising:
at least one computer; and
a computer-readable storage medium storing program code executable by said at least one computer, comprising:
program code to extract information from the detected radiation;
program code to construct an optical model and to calculate information for the optical model simulating the two-dimensional periodic sample using a compressed two-dimensional Fourier space having fewer harmonic orders than in a non-compressed two-dimensional Fourier space formed using the same truncation as the compressed two-dimensional Fourier space;
program code to compare the calculated information to the extracted information to determine parameters of the two-dimensional periodic sample; and
program code to store the determined parameters of the two-dimensional periodic sample.

21. The apparatus of claim 20, wherein the radiation source emits radiation with a plurality of wavelengths.

22. The apparatus of claim 20, wherein the computer-readable storage medium storing program code further comprises: program code to repeatedly adjust a variable parameter of the optical model and to provide calculated information for the adjusted optical model and to compare the calculated information for each adjusted optical model to the extracted information until an acceptable fit occurs.

23. The apparatus of claim 20, wherein the two-dimensional Fourier space is a Fourier transform of the permittivity function.

24. The apparatus of claim 20, wherein the optical model comprises a plurality of slices, and wherein the compressed two-dimensional Fourier space is used for each slice.

25. A method comprising:
providing a model of a two-dimensional periodic sample to a computer;
simulating with the computer the response of the two-dimensional periodic sample to incident light using the model;
determining with the computer a contribution of a plurality of harmonic orders in a two-dimensional Fourier space during the simulation of the response;
selecting with the computer harmonic orders in the two-dimensional Fourier space based on the harmonic orders contribution to the result of the simulation;
compressing with the computer the two-dimensional Fourier space to include the selected harmonic orders; and
storing in the computer the compressed two-dimensional Fourier space in memory.

26. The method of claim 25, wherein the two-dimensional Fourier space is a Fourier transform of the permittivity function.

27. The method of claim 25, wherein the model comprises a plurality of slices, and wherein the determining the contribution of each harmonic order and selecting harmonic orders is performed for all slices in the model and wherein compressing the two-dimensional Fourier space includes all the selected harmonic orders from each slice.

28. The method of claim 25, wherein the model comprises a plurality of slices, and wherein determining the contribution of each harmonic order comprises combining corresponding harmonic orders from each slice.

29. The method of claim 25, wherein selecting with the computer harmonic orders comprises comparing with the computer the harmonic orders to a threshold value.

30. The method of claim 25, further comprising:
calculating the response of the two-dimensional periodic sample to incident light using the model and the compressed Fourier space;
comparing the calculated response to a response of the two-dimensional periodic sample to incident light produced using the model and non-compressed Fourier space; and
selecting different harmonic orders in the two-dimensional Fourier space, compressing the two-dimensional Fourier space to include the different selected harmonic orders, and iteratively repeating calculating the response and comparing until the calculated response and the response of the two-dimensional periodic sample to incident light produced using the model and uncompressed Fourier space fit.

31. The method of claim 25, further comprising calculating a response of the two-dimensional periodic sample to incident light using the model and the compressed Fourier space.

32. The method of claim 31, wherein calculating a response is performed in real-time during a measurement of an unknown sample.

33. The method of claim 31, further comprising calculating a plurality of responses of the two-dimensional periodic sample to incident light using the model with different variable parameters and the compressed Fourier space and storing the plurality of responses in a library.

34. The method of claim 25, further comprising providing the stored compressed two-dimensional Fourier space to be used in an optical metrology system that measures a physical sample.

* * * * *